(12) United States Patent
Fröschle et al.

(10) Patent No.: US 6,444,265 B1
(45) Date of Patent: Sep. 3, 2002

(54) METHOD FOR PRODUCING A TITANIUM MONOPHOSPHIDE LAYER AND ITS USE

(75) Inventors: Barbara Fröschle, Dornstadt; Roland Leutenecker, Wiedenzhausen; Peter Ramm, Pfaffenhofen, all of (DE)

(73) Assignee: Fraunhofer-Gesellschaft zur Foerderung der Angewandten Forchung E.V., Munich (DE)

( * ) Notice: Subject to any disclaimer, the term of this patent is extended or adjusted under 35 U.S.C. 154(b) by 0 days.

(21) Appl. No.: 09/319,094

(22) PCT Filed: Nov. 20, 1997

(86) PCT No.: PCT/EP97/06497

§ 371 (c)(1),
(2), (4) Date: May 28, 1999

(87) PCT Pub. No.: WO98/24117

PCT Pub. Date: Jun. 4, 1998

(30) Foreign Application Priority Data

Nov. 29, 1996 (DE) .......................... 196 49 684

(51) Int. Cl.$^7$ .......................... C23C 16/30; C23C 16/34; C23C 16/56
(52) U.S. Cl. .......................... 427/255.38; 427/255.39; 427/255.391; 427/255.394; 427/255.7
(58) Field of Search .................. 427/255.28, 255.38, 427/255.39, 255.391, 255.394, 255.7, 372.2

(56) References Cited

U.S. PATENT DOCUMENTS 4,670,065 A * 6/1987 Yasuda et al. .................. 148/2
5,926,726 A * 7/1999 Bour et al. .................. 438/507

FOREIGN PATENT DOCUMENTS

DE 10049684 * 11/1996
JP 0316534 * 11/1998

OTHER PUBLICATIONS

Leutenecker et al., "Titanium monophosphide (TiP) layers as potential diffusion Barriers," Elsevier Science B.V.
Lewkebandara et al., "Precursor for the Low–Temperature Deposition of Titanium Phosphide Films," 1995 Amer. Chem. Soc., Jun. 7, 1995, No. 6.
La Via et al., "Rapid thermal processing reliabilty of titanium Silicide implanted with arsenic, boron and phosphorus," XP002060933 & 1991 European Workshop on Refractory Metals and Silicides, Saltsjobaden, Sweden, Mar. 24–27, 1991, vol. 53.
Sasaki et al., "Composition of phosphide films formed by titanium–phosphorus reaction and the deiffusing species," Denki Kagaku Oyobi Kogyo Butsuri Kagaku, vol. 52, No. 3, 1984, pp. 203–204.
Kolawa et al., Chemical Abstracts, vol. 115, No. 16, Oct. 21, 1991, Columbus, Ohio, US, Abstract No. 164194 & New Technol. Electron. Packag., Proc. ASM Int. Electron. Mater. Process. Congr., No. 3 (1990).

* cited by examiner

*Primary Examiner*—Bret Chen
(74) *Attorney, Agent, or Firm*—Michael A. Glenn

(57) ABSTRACT

In a method for producing a titanium monophosphide layer, a carrier is first placed in a reactor. Thereafter, a TiN layer is deposited on the carrier by supplying TiCl$_4$ ad NH$_3$ into the reactor. The TiN layer is annealed immediately after deposition of the TiN layer while PH$_3$ is supplied to the reactor, in order to form the titanium monophosphide layer on the TiN layer.

11 Claims, 1 Drawing Sheet

METHOD FOR PRODUCING A TITANIUM MONOPHOSPHIDE LAYER AND ITS USE

BACKGROUND OF THE INVENTION

1. Field of the Invention

The present invention relates to a method for producing a titanium monophosphide layer on a titanium nitride layer. The present invention relates in particular to such a method that can be employed during the production of a multilayer metallization on a semiconductor material.

2. Description of Prior Art

It is known to deposit titanium monophosphide, TiP, at temperatures in the range of 1000° C. in the presence of catalysts such as Au, Pt or Pd. The lowest temperature value described for the production of titanium phosphides is 750° C.

Such a formation of TiP is described, for example, by S. Motojima, T. Wakamatsu, Y. Takahashi and K. Sugiyama, J. Electrochem. Soc., 123 (1976), 290. Said publication describes the whisker formation of titanium phosphides. Titanium monophosphide was formed from $TiCl_4$ and $PCl_3$ at temperatures from 850° C. to 1150° C. on catalysts such as Pt, Pd and Au. The deposition of thin layers of TiP is not disclosed in this publication.

It is generally known in the field of semiconductor technology to produce diffusion barriers between silicon and an aluminum metallization by reactive sputtering of titanium nitride (TiN). Typical layer thicknesses of the titanium nitride are about 50 nm. The disadvantage of sputtering is the inferior edge covering, in particular in narrow and deeply etched structures. CVD methods (CVD=chemical vapor deposition) provide improved edge covering.

As an alternative to deposition of the type indicated above, methods of forming titanium nitride are known which are based on the decomposition of organometallic precursors that already contain Ti—N complexes. Furthermore, it is known to deposit titanium nitride using titanium tetrachloride ($TiCl_4$) and ammonia ($NH_3$). When decomposing organometallic precursors, the high carbon concentration built in as well causes problems. In the deposition of a titanium nitride layer using $TiCl_4$ and $NH_3$, the takeup of chlorine causes problems, which increases the resistivity of the barrier and may lead to corrosion of the aluminum. Furthermore, in case of multilayer metallization on a semiconductor, temperatures up to 450° C. are admissible only. However, the $TiCl_4/NH_3$ reaction yields layers with a critical Cl concentration below 2 at % only at temperatures >550° C.

In order to reduce in the titanium nitride layer the too high chlorine concentration produced in the $TiCl_4/NH_3$ process at 450° C., it is known to reduce the built-in impurities of Cl atoms as well as incompletely reacted fragments of the precursors ("$TiN_xCl_y$") by subsequent ("in-situ") annealing. The resistivity of the titanium nitride layers correlates with the chlorine concentration, with the residual chlorine content being a measure for the completeness of the reaction. The reactive gas $NH_3$ is known as annealing gas for the extraction of chlorine. By annealing the titanium nitride layer using $NH_3$ at 450° C. and for a duration of 120 seconds, the Cl content can be reduced to <2 at %. The resistivity of this annealed layers has a value of <300 $\mu\Omega$cm. It is thus considerably lower than in case of layers deposited by conventional CVD and a corresponding temperature.

As a mechanism for the extraction of chlorine in the abovementioned reaction gas annealing step, $NH_3$ shifts the reaction equilibrium of the total reaction

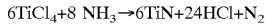

$$6TiCl_4 + 8\ NH_3 \rightarrow 6TiN + 24HCl + N_2$$

due to the high $NH_3$ supply, in the direction towards the final products TiN+HCl.

The article "Precursor for the low-temperature deposition of titanium phosphide films" by T. S. Lewkebandara et al. in: Chemistry of Materials, Vol. 7, No. 6, Jun. 1, 1995, Washington, US, pages 1053 and 1054, describes the deposition of a TiP film on a substrate of glass or silicon. To this end, the use of a low pressure chemical vapor deposition (LPCVD) is taught, making use of a complex of titanium tetrachloride and cyclohexylphosphine. Furthermore, the said article mentions the deposition of $TiCl_4$ and $PCl_3$.

Chemical Abstracts, Vol. 115, No. 16, Oct. 21, 1991, Columbus, Ohio, US, Abstract No. 164194 & New Technol. Electron. Packag., Proc. ASM Int. Electron. Mater. Process. Congr., No. 3 (1990), Ohio, US, pages 243–347, E. Kolawa et al.: "Amorphous ternary thin-film alloys as diffusion barriers in silicon metallizations", describes the production of a thin barrier layer of $TiPN_2$ with the aid of a sputtering method.

SUMMARY OF THE INVENTION

It is an object of the present invention to provide a method for producing a titanium monophosphide layer on a titanium nitride layer.

In accordance with a first aspect of the present invention, this object is achieved by a method for producing a titanium monophosphide layer (TiP layer) comprising the following steps:

a) placing a substrate in a reactor;

b) depositing a TiN layer on the substrate by supplying $TiCl_4$ and $NH_3$ to the reactor; and c) annealing the TiN layer while supplying $PH_3$ to the reactor immediately after deposition of the TiN layer, so as to form the titanium monophosphide layer on the TiN layer.

A further object of the present invention consists in making available a diffusion barrier layer with improved properties between a semiconductor material, a dielectric or a ferroelectric material and a deposited metallization.

In accordance with a second aspect of the present invention, this object is achieved by a diffusion barrier layer between a semiconductor material, a dielectric or a ferromagnetic material and a metallization deposited thereon, consisting of a bilayer comprising a TiN layer and a TiP layer.

The present invention is based on the realization that a titanium monophosphide layer (TiP layer) can be formed on a titanium nitride layer (TiN layer) when a TiN layer deposited in a conventional process using titanium tetrachloride and ammonia is subjected, immediately after the deposition, to annealing in the same reactor, while phosphine ($PH_3$) is supplied thereto. Phosphine is more active than $NH_3$ as a donor for hydrogen and thus as a getter for Cl ($PH_3$: $\Delta G_f = 13.6$ kJ/mol; $NH_3$: $\Delta G_f = -16.4$ kJ/mol). Phosphine at the same time can serve as a getter for oxygen.

Consequently, the present invention is based on the realization that cover layers of pure titanium monophosphide can be deposited preferably at 450° C. by the annealing of layers of titanium nitride in phosphine. The phase TiP as well as the layer structure as a double layer or bilayer can be identified in unequivocal manner for example by means of X-ray diffractometers or by means of Auger electron spectroscopy. The TiN layers preferably are deposited on silicon wafers by an RTCVD process (RTCVD=Rapid Thermal Chemical Vapor Deposition) using titanium tetrachloride and ammonia. Annealing of the wafers in $PH_3$ follows immediately thereafter in the same reactor.

The method according to the invention can be used advantageously in semiconductor technology in order to form a diffusion barrier layer between a semiconductor material, for example silicon, and a metallization, for example aluminum. The diffusion barrier then consists of a bilayer consisting of TiN and TiP.

The present invention thus provides, according to a further aspect, a diffusion barrier layer between a semiconductor material and a metallization deposited thereon, the diffusion barrier layer consisting of a bilayer comprising a TiN layer and a TiP layer. Such a diffusion barrier layer has numerous advantages as compared to a conventional diffusion barrier layer consisting of TiN.

The TiP coating layer produced has a very low resistivity as compared to TiN. Furthermore, it seals the entire TiN layer against the takeup of oxygen. The roughness of TiP is less than that of TiN. Furthermore, tensile stresses in the TiP coating layer are low in comparison with annealed TiN layers.

Further developments of the present invention are indicated in the dependent claims.

BRIEF DESCRIPTION OF THE DRAWINGS

Preferred developments of the present invention will be elucidated in more detail hereinafter with reference to the accompanying drawings in which.

DESCRIPTION OF PREFERRED EMBODIMENTS OF THE INVENTION

Figure 1:
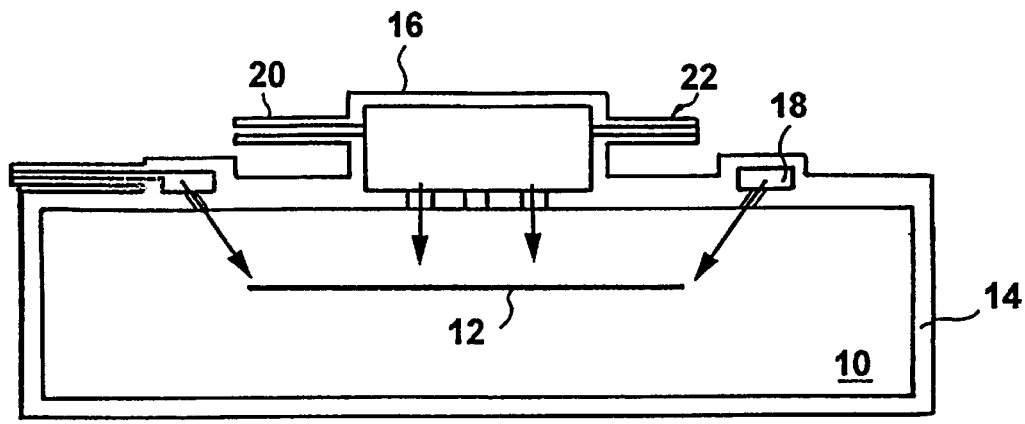
FIG. 1 shows a schematic representation of the structure of a reactor.

With reference to FIG. 1, a reactor will be elucidated in the following that is suitable for performing the method according to the invention. Such a reactor is also referred to as RTP plant (RTP=Rapid Thermal Processing).

With reference to FIG. 1, a reactor will be elucidated in the following that is suitable for performing the method according to the invention. Such a reactor is also referred to as RTP system (RTP=Rapid Thermal Processing).

The reactor consists of a substantially closed inner space IO having a plurality of entrances. Reactor 10 comprises furthermore a supporting structure, not shown in FIG. 1, for supporting a semiconductor to be processed, for example a silicon substrate 12. The reactor has furthermore a lamp heater and a quartz window, and the silicon substrate 12 can be heated to process temperature by means of the lamp heater through the quartz window. In doing so, the nominal temperature is reached within some 10 seconds. The heater may consist, for example, of halogen rod lamps surrounded by a reflector. Such halogen rod lamps may have a maximum heating power of 72 kW. A reactor vessel 14 in case of known reactors consists of special steel.

Disposed in reactor vessel 14 are two separate gas supply systems. A first gas supply system 16, which may be a device generally known as gas shower in the art, serves to flow a gas from above to the silicon substrate 12. The gas shower 16 furthermore serves to prevent reactions in an inlet system by means of a pressure stage. Another gas supply system 18 is referred to as ring line and may have, for example, twelve nozzles directed obliquely downwardly, directly on the silicon substrate 12.

According to the method according to the invention, at first the silicon substrate 12 is introduced into the interior space 10 of reactor vessel 14 through an introduction opening, not shown. The chamber walls and the quartz window described hereinbefore are heated to almost 60° C. in order to prevent condensation of $TiCl_4$. The $TiCl_4$ is introduced in diluted manner in an $N_2$ carrier gas via gas shower 16, with $TiCl_4$ being supplied to the gas shower via an inlet system 20 and $N_2$ being supplied thereto via an inlet system 22. The $NH_3$ is also introduced into the reactor vessel in diluted manner in $N_2$, via the ring line 18 and the nozzles thereof. The two substances $TiCl_4$ and $NH_3$ are mixed only shortly above the silicon substrate 12 since they react even at room temperature.

By the steps described hereinbefore, a TiN layer is deposited on the silicon substrate 12 in known manner. Upon conclusion of the TiN layer deposition, $PH_3$ diluted in argon is supplied to the reactor vessel immediately thereafter via the ring line 18. A TiP layer is formed thereby on the TiN layer. This step concludes the method according to the invention.

In the following, preferred process parameters for depositing TiP/TiN bilayers according to the present invention will be elucidated. The substrate, i.e. in the preferred embodiment the silicon substrate 12, is heated preferably to a temperature of 450° C. This is the maximum temperature permissible in multilayer metallization on semiconductors. The base pressure in the reactor vessel is set to a value between $0.5 \times 10^{-3}$ to $5 \times 10^{-3}$ Pascal, and preferably to a value of $2 \times 10^{-3}$ Pascal.

The TiN deposition in the reactor employed, which was a reactor of the type "Jetlight 200" of the company Jipelec, was performed at the following flows: 5 sccm $TiCl_4$ diluted by 400 sccm $N_2$ (sccm =standard cubic centimeter per minute at room temperature and normal pressure); 50 sccm $NH_3$ diluted by 350 sccm $N_2$.

The deposition of the TiN layer preferably employs a ratio of $TiCl_4$ to $N_2$ between 1:60 and 1:100. A specific preferred ratio is 1:80. The ratio of $NH_3$ to $N_2$ is preferably set between 1:5 and 1:9, with a specific preferred ratio being 1:7.

The deposition of the TiN layer thus was performed in the known reactor described hereinbefore with an overall flow of 805 sccm at a pressure of 400 Pa and a deposition time of 180 seconds.

Annealing of the TiN layer was performed thereafter, supplying a flow of 130 sccm $PH_3$ diluted with 750 sccm argon. This mixture is supplied through the ring line 18 in p remixed manner. Therefore, a total flow of 880 sccm at a pressure of 250 Pa and an annealing time of 600 seconds was employed.

A preferred range for the ratio of $PH_3$ and argon in annealing is between 1:3 and 1:8. In the method described hereinbefore, a ratio of 1:5.77 was employed.

As the annealing step of the TiN layer is performed using $PH_3$ immediately after deposition of the TiN layer in the same reactor, there are still unreacted or not completely dissociated residues of the precursor $TiCl_4$ are still present in the reactor. It is known from the classical $TiCl_4/NH_3$ process that adducts of the type $TiCl_4 \cdot xNH_3$ (x=2, 4, 6, 8) always are formed in this process, which adsorb at the reactor walls. With a low-temperature deposition at or below 450° C., incompletely transformed residues of the precursor still are present also at the wafer surface in the form of $TiN_xCl_y$, which can react later on. This surface, as long as it is not oxidized, may have a catalytic action in order to support or induce the formation of TiP. For transforming these unreacted or incompletely transformed initial substances to TiP, a high concentration of PH$_3$ in relation to the presence of the TiCl$_4$ component is advantageous. The maximum achievable flow of PH$_3$ is 130 sccm. With this flow, the growth of TiP across the wafer is not yet homogenous, but depends on the inflow of PH$_3$ from the nozzles of the ring line. The reaction consequently still is transport—controlled. In contrast thereto, a homogenous after-growth during annealing takes place in case of the known annealing step supplying NH$_3$, in which a higher total flow of 600 sccm is possible.

Figure 2:
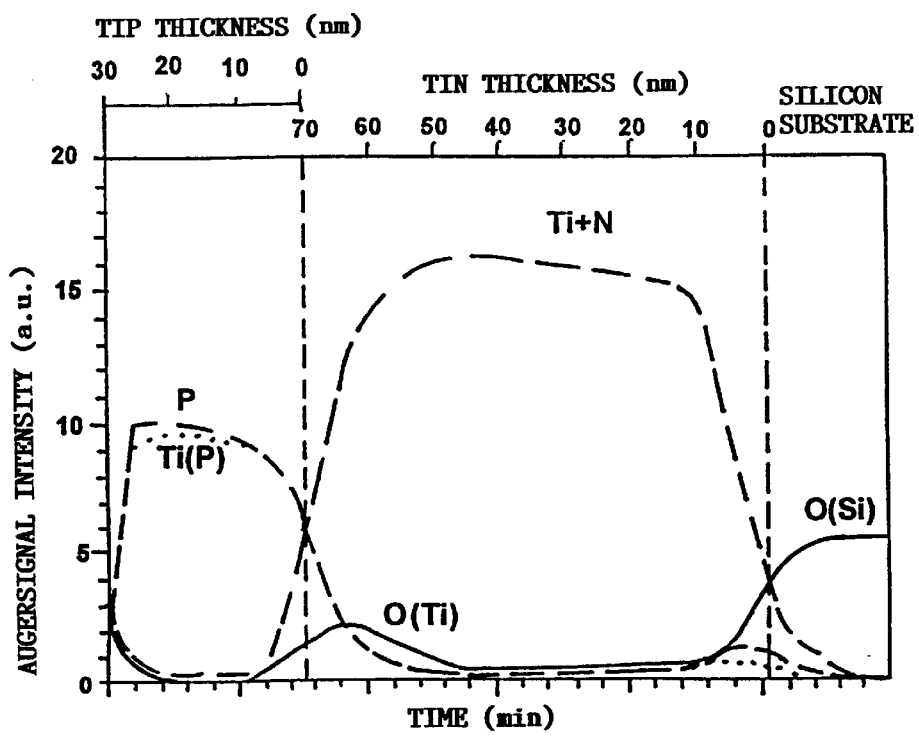
FIG. 2 shows a representation of depth profiles of a TiP/TiN bilayer, taken up by means of Auger electron spectroscopy.

FIG. 2 shows the depth profiles of the TiP/TiN bilayer obtained by the method according to the invention, taken up by means of an Auger electron spectroscopy. It results from the combination of integral area occupancies of the elements Ti, P and N (RBS; RBS=Rutherford Back Scattering) and the Auger electron spectroscopy depth profiles that an additional layer having a stoichiometry Ti:P=1:1 is grown on TiN during annealing. On the time scale shown in FIG. 2, the greater graduations indicate 5 minutes each, whereas the smaller graduations indicate 1 minute each. In the method according to the invention, the time axis extends from the right to the left, i.e. the TiN layer is deposited first, whereas the TiP layer is deposited thereafter. With an annealing time of 600 seconds and the method parameters elucidated hereinbefore, the resulting thickness of the TiP layer is about 30 nm. The TiP phase produced, in contrast to TiN, is polycrystalline (<100> texture). The formation enthalpy of TiP, being ΔGf=−265 kJ/mol, is in its amount comparable to that of TiN (−310 kJ/mol).

The TiP/TiN bilayer produced by the method according to the invention, constituting a diffusion barrier between a semiconductor and a metallization, comprises excellent properties.

The resistivity of the TiP deposited is about 20 $\mu\Omega$cm. A comparison with the TiN layers having a resistivity of about 200 to 300 $\mu\Omega$cm, and aluminum, 2.7 $\mu\Omega$cm, indicates that the TiP produced is a good electrical conductor. Furthermore, the TiP layer itself is free from Cl, whereas the TiN layer therebeneath displays Cl values <2 at % after annealing, as in case of NH$_3$ annealing. Due to the annealing step including the supply of NH$_3$, Cl is rapidly removed from the predeposited TiN layer.

The TiP layer produced comprises a thin covering oxide, but in contrast to the TiN layer is itself free from O. The TiP layer constitutes a sealing since it absorbs no oxygen during annealing and while being stored in the presence of air. The reason therefor is that the grains of the TiN layer are columnar, with their width being only 5 to 10% of their length. In contrast thereto, the grains of the TiP layer are polyedric, with their diameter both in the layer plane and perpendicular thereto being in the order of magnitude of the layer thickness. TiN is porous due to the columnar structure, whereas there are no channels present between the TiP grains.

The TiP layer partly levels out the roughness of the columnar TiN and imparts thereto a longer wave structure. The TiP layer thus provides a surface of reduced roughness in comparison with a TiN layer. A TiN layer annealed according to the prior art shows tensile stresses of 2 to 3 GPa, whereas the TiP layer according to the present invention has a maximum tensile stress of 1 GPa. The TiP layer thus is capable of providing a better mechanical matching of barrier and, for example, Al metallization. Furthermore, TiP is thermally very stable against the loss of phosphorus, so that it is prevented that phosphorus diffuses into the semiconductor used, which in case of the preferred embodiment is silicon, and has a doping effect therein.

The titanium monophosphide layer according to the invention, furthermore, can be used advantageously with ferroelectric components. Another important application of TiP in this respect exists in the manufacture of DRAMs (DRAM=dynamic random access memory) with dielectrics or ferroelectrics having a high dielectric constant (so-called high epsilon dielectrics and ferroelectrics, respectively).

The construction of such a structure consists of a polysilicon contact layer having a diffusion barrier to a storage electrode, consisting of RuO$_2$, for example. This diffusion barrier has to act both against metal diffusion and against oxygen diffusion. This effect is not obtainable with a plain TiN layer, so that for example a layer system TiN—Ru has been used in the art so far. According to the present invention, a TiN/TiP layer can be used in advantageous manner as such a diffusion barrier.

Furthermore, the contact between the dielectric material, for example BST (BST=barium strontium titanate), and the metallization is necessary. Here too, the layer system TiN/TiP according to the invention can be used in advantageous manner.

The present invention thus provides a method for producing TiP/TiN bilayers, with the formation of the TiP layer taking place within the temperature range permissible in the multilayer metallization of semiconductors. The bilayer produced is excellently suited as diffusion barrier between a semiconductor, for example silicon, and a metallization, for example aluminum, as well as diffusion barrier between dielectrics or ferroelectrics and a contact layer.

What is claimed is:

1. A method for producing a titanium monophosphide layer (TiP) comprising the following steps:
    a) p lading a substrate in a reactor,
    b) depositing a TiN layer on the substrate by supplying TiCl$_4$ and NH$_3$ to the reactor, and
    c) annealing the TiN layer while supplying PH$_3$ to the reactor immediately after deposition of the TiN layer, so as to form the titanium monophosphide layer on the TiN layer.

2. The method of claim 1, wherein the substrate is a silicon wafer.

3. The method of claim 1, wherein steps b) and c) are carried out at a temperature of 450° C. at maximum.

4. The method of claim 1, wherein steps b) and c) are carried out at a base pressure between 0.5×10$^{-3}$ Pa and 5×10$^{-3}$ Pa.

5. The method of claim 4, wherein steps b) and c) are carried out at a base pressure of 2×10−3 Pa.

6. The method of claim 1, wherein in step b) the TiCl$_4$ is introduced diluted in N$_2$ via a gas shower of the reactor and the NH3 is introduced diluted in N$_2$ via a ring line of the reactor.

7. The method of claim 6, wherein the ratio of TiCl$_4$ to N$_2$ in the supply via the gas shower is between 1:60 and 1:100, wherein the ratio of NH$_3$ to N$_2$ in the supply via the ring line is between 1:5 and 1:9.

8. The method of claim 7, wherein the ratio of TiCl$_4$ in the supply via the gas shower is 1:80, and wherein the ratio of NH$_3$ to N$_2$ in the supply via the ring line is 1:7.

9. The method of claim 1, wherein PH$_3$ in step c) is supplied diluted in argon via a ring line of the reactor.

10. The method of claim 9, wherein the ratio of PH$_3$ to argon is between 1:3 and 1:8.

11. The method of claim 10, wherein the ratio of PH$_3$ to argon is 1:5.77.

* * * * *